(12) United States Patent
Shirahata et al.

(10) Patent No.: US 10,458,017 B2
(45) Date of Patent: Oct. 29, 2019

(54) FILM-FORMING APPARATUS TO FORM A FILM ON A SUBSTRATE

(71) Applicant: TOSHIBA MITSUBISHI-ELECTRIC INDUSTRIAL SYSTEMS CORPORATION, Chuo-ku (JP)

(72) Inventors: Takahiro Shirahata, Tokyo (JP); Hiroyuki Orita, Tokyo (JP); Takahiro Hiramatsu, Tokyo (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 515 days.

(21) Appl. No.: 14/440,000

(22) PCT Filed: Nov. 5, 2012

(86) PCT No.: PCT/JP2012/078580
§ 371 (c)(1),
(2) Date: Apr. 30, 2015

(87) PCT Pub. No.: WO2014/068778
PCT Pub. Date: May 8, 2014

(65) Prior Publication Data
US 2015/0299854 A1    Oct. 22, 2015

(51) Int. Cl.
*B05B 7/00* (2006.01)
*B05B 7/04* (2006.01)
(Continued)

(52) U.S. Cl.
CPC .......... *C23C 16/455* (2013.01); *B05B 7/0012* (2013.01); *B05B 7/0483* (2013.01);
(Continued)

(58) Field of Classification Search
None
See application file for complete search history.

(56) References Cited

U.S. PATENT DOCUMENTS

| 3,382,845 | A | 5/1968 | Edward |
| 6,805,907 | B2 | 10/2004 | Sun et al. |

(Continued)

FOREIGN PATENT DOCUMENTS

| EP | 1 475 234 | 12/2006 |
| JP | 2-273578 | 11/1990 |

(Continued)

OTHER PUBLICATIONS

Notification of Reasons for Refusal dated Feb. 1, 2017 in Korean Patent Application No. 10-2015-7010105 (with partial English language translation).

(Continued)

*Primary Examiner* — Binu Thomas
(74) *Attorney, Agent, or Firm* — Oblon, McClelland, Maier & Neustadt, L.L.P.

(57) ABSTRACT

A film forming apparatus includes a spray nozzle, a first chamber, a first gas supply port, a second chamber, a through hole, and a mist outlet. A solution transformed into droplets that is to be sprayed from the spray nozzle is housed in the first chamber and transformed into a mist in the first chamber by gas injected from the first gas supply port. The solution in mist form moves from the first chamber through the through hole to the second chamber and is misted onto a substrate from the mist outlet of the second chamber.

12 Claims, 6 Drawing Sheets

Figure 1:
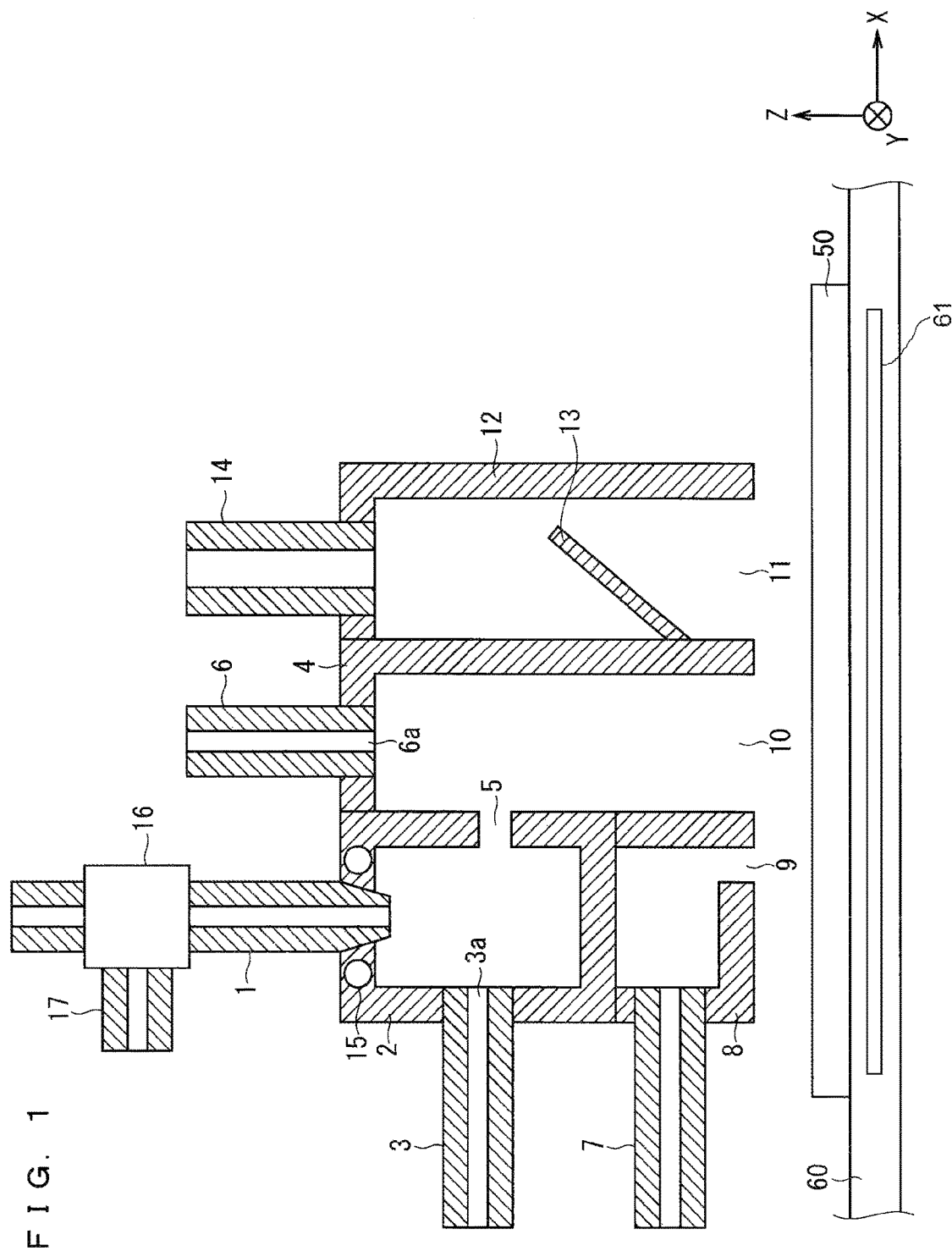

(51) Int. Cl.
*C23C 16/448* (2006.01)
*B05B 14/00* (2018.01)
*B05B 12/18* (2018.01)
*B05B 15/55* (2018.01)
*B05B 7/08* (2006.01)
*C23C 16/455* (2006.01)
*C23C 16/44* (2006.01)
*C23C 16/46* (2006.01)
*B05B 1/04* (2006.01)

(52) U.S. Cl.
CPC .............. *B05B 12/18* (2018.02); *B05B 14/00* (2018.02); *B05B 15/55* (2018.02); *C23C 16/4412* (2013.01); *C23C 16/4486* (2013.01); *C23C 16/46* (2013.01); *B05B 1/044* (2013.01); *B05B 7/0075* (2013.01); *B05B 7/0807* (2013.01); *B05B 7/0861* (2013.01)

(56) References Cited

U.S. PATENT DOCUMENTS

| | | | |
|---|---|---|---|
| 8,017,186 | B2 | 9/2011 | Fujii |
| 9,327,299 | B2 | 5/2016 | Asikkala |
| 2002/0192375 | A1* | 12/2002 | Sun ..................... C23C 16/448 118/726 |
| 2004/0261817 | A1* | 12/2004 | Araki ................ H01L 21/67051 134/2 |
| 2005/0050760 | A1* | 3/2005 | Itoh ................... H01L 21/67034 34/580 |
| 2011/0192909 | A1* | 8/2011 | Liu ..................... C23C 16/4486 239/4 |
| 2012/0258251 | A1 | 10/2012 | Asikkala |
| 2013/0247820 | A1* | 9/2013 | Orita ................. C23C 16/45514 118/313 |
| 2014/0141170 | A1* | 5/2014 | Orita ................. C23C 16/4486 118/300 |

FOREIGN PATENT DOCUMENTS

| | | |
|---|---|---|
| JP | 2001-321701 A | 11/2001 |
| JP | 2001 327898 | 11/2001 |
| JP | 2005 307238 | 11/2005 |
| JP | 2007 144297 | 6/2007 |
| JP | 2010-247106 A | 11/2010 |
| JP | 2011 167675 | 9/2011 |
| TW | 200829339 | 7/2008 |
| WO | WO 2011/080397 A1 | 7/2011 |
| WO | WO 2012/124047 A1 | 9/2012 |

OTHER PUBLICATIONS

Office Action dated on Sep. 15, 2015 in Japanese Patent Application No. 2014-544189 with partial English translation.
Taiwanese Search Report dated Sep. 2, 2014 in Taiwanese Patent Application No. 102104527 (with partial English translation).
International Search Report dated Jan. 22, 2013 Filed in PCT/JP2012/078580, filed Nov. 5, 2012.
International Preliminary Report on Patentability and Written Opinion dated May 14, 2015 in PCT/JP2012/078580, filed on Nov. 5, 2012 (with English translation).
Combined Chinese Office Action and Search Report dated Apr. 28, 2016 in Patent Application No. 201280076801.5 (with partial English translation and partial Japanese translation).
Extended Search Report dated Jun. 7, 2016 in European Patent Application No. 12887704.0.
Combined Office Action and Search Report dated Oct. 25, 2016 in Chinese Patent Application No. 201280076801.5 with partial English translation and Japanese translation.
Office Action dated Nov. 5, 2018 in European Patent Application No. 12 887 784.0, 6 pages.

* cited by examiner

FILM-FORMING APPARATUS TO FORM A FILM ON A SUBSTRATE

CROSS-REFERENCE TO RELATED APPLICATIONS

The present application is a national stage application of PCT/JP2012/078580 filed on Nov. 5, 2012, the entire disclosure of which is hereby incorporated herein by reference.

TECHNICAL FIELD

The present invention relates to a film forming apparatus for forming a film on a substrate.

BACKGROUND ART

Conventional techniques for forming a film on a substrate include a "spray method" and a "mist method." The "spray method" involves spraying droplets of approximately 10 μm to 100 μm in diameter onto a substrate. The "mist method" involves misting droplets of approximately several micrometers in diameter onto a substrate.

The spray method typically uses a two-fluid spray nozzle that bombards a solution with gas to transform the solution into droplets of approximately several ten micrometers in diameter. On the other hand, the mist method uses, for example, an ultrasonic vibrator to transform a solution into a mist of fine droplets of approximately several micrometers in diameter, and conveys the solution in mist form through a long pipe to a reaction chamber where a substrate is placed (or to a mist outlet).

One example of prior art literature on the spray method is Patent Document 1, and one example of prior art literature on the mist method is Patent Document 2.

PRIOR ART LITERATURE

Patent Literature

Patent Literature 1: Japanese Patent Application Laid-open No. 2007-144297
Patent Literature 2: Japanese Patent Application Laid-open No. 2005-307238

SUMMARY OF THE INVENTION

Problems to be Solved by the Invention

The spray method, however, usually requires that a high pressure gas with a high flow rate be used to bombard the solution. Droplets thus have a high initial velocity and directly collide with the substrate that is being heated. Since the droplets have a large diameter of approximately one hundred to several ten micrometers, they cannot receive the thermal energy necessary for a chemical reaction. The spray method may thus result in deterioration in the quality of the film that is formed on the substrate.

On the other hand, this problem with the spray method does not occur with the mist method in which a solution that has been transformed into a mist of droplets of approximately several micrometers in diameter is misted onto a substrate. In other words, with the mist method in which the solution in mist form is conveyed with a stream of carrier gas and supplied to the heated substrate, the mist has a low initial velocity and the solvent evaporates in the vicinity of the substrate surface. The mist method thus results in improvement in the quality of the film that is formed on the substrate.

However, the mist method requires a large mechanism for transforming a solution into a mist. This increases the overall size of a film forming apparatus to which the mist method is applied.

Additionally, a film forming apparatus to which the mist method is applied needs to convey the solution in mist form through a long pipe to a reaction chamber where the substrate is placed (or to a mist outlet). Consequently, the solution in mist form tends to coagulate in the pipe. The mist method thus may encounter difficulties in efficiently using materials (solution) in the film forming process.

Moreover, this coagulation of the solution in the pipe causes the mist that is conveyed to a substrate to have a non-uniform concentration. It is thus necessary to provide a mechanism for rectifying the mist in the mist supply unit that is in the vicinity of the substrate. A film forming apparatus to which the mist method is applied thus also suffers from problems of the increased size and weight of the mist supply unit and maintenance difficulties.

In view of this, it is an object of the present invention to provide a film forming apparatus that enables formation of a high-quality film on a substrate, effective use of a solution in the film forming process, and downsizing of the apparatus as a whole.

Means for Solving the Problems

To achieve the above-described object, the film forming apparatus according to the present invention is a film forming apparatus for forming a film on a substrate. It includes a spray nozzle from which a solution in droplet form is to be sprayed, a first chamber capable of housing the solution in droplet form that is to be sprayed from the spray nozzle, a first gas supply port from which gas is to be injected and caused to collide with the solution housed in the first chamber, a second chamber provided adjacent to the first chamber, a through hole that is formed in a wall surface between the first chamber and the second chamber and through which the solution that has collided with the gas injected from the first gas supply port and been transformed into a mist is led from the first chamber into the second chamber, and a mist outlet that is formed in the second chamber to face the substrate provided outside the second chamber and from which the solution in mist form is misted onto the substrate.

Advantageous Effects of the Invention

The film forming apparatus according to the present invention includes a spray nozzle from which a solution in droplet form is to be sprayed, a first chamber capable of housing the solution in droplet form that is to be sprayed from the spray nozzle, a first gas supply port from which gas is to be injected and caused to collide with the solution housed in the first chamber, a second chamber provided adjacent to the first chamber, a through hole that is formed in a wall surface between the first chamber and the second chamber and through which the solution that has collided with the gas injected from the first gas supply port and been transformed into a mist is led from the first chamber into the second chamber, and a mist outlet that is formed in the second chamber to face the substrate provided outside the second chamber and from which the solution in mist form is misted onto the substrate.

The film forming apparatus according to the present invention is capable of transforming the solution in spray form that is sprayed from the spray nozzle into a mist inside the first chamber by bombarding the solution with the gas ejected from the first gas supply port. This enables the solution in spray form to be transformed into a mist and misted onto the substrate, without the solution coming in direct contact with the substrate. It is thus possible to achieve film formation similar to CVD film formation in the atmosphere. The film forming apparatus can therefore form a high-quality film on the substrate.

Moreover, the film forming apparatus according to the present invention transforms a solution in spray form into a mist inside the first chamber, which is located in the vicinity of the mist outlet from which the solution is misted onto the substrate. This makes the conveyance distance of the solution in mist form considerably shorter than in conventional film forming apparatuses employing the mist method, inhibiting coagulation of the solution in mist form during conveyance. The film forming apparatus according to the present invention can therefore effectively use the solution in the film forming process and mist the solution with a stable concentration onto a substrate.

Moreover, the film forming apparatus according to the present invention transforms a solution in spray form into a mist by bombarding the sprayed solution with the gas. In other words, the film forming apparatus according to the present invention has an extremely simple configuration for transforming a solution into a mist and also eliminates the need for an ultrasonic vibrator or other elements. The film forming apparatus according to the present invention can therefore achieve downsizing of the apparatus as a whole. This simple configuration also contributes to increased ease of maintenance of the film forming apparatus according to the present invention.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a cross-sectional view showing a configuration of principal part of a film forming apparatus according to an embodiment of the present invention.

FIG. 2 is a plan view showing a configuration of principal part of the film forming apparatus according to the embodiment of the present invention as viewed from above.

FIG. 3 is an enlarged cross-sectional view of a configuration including a first chamber 2 and components connected to the first chamber 2.

FIG. 4 is an enlarged cross-sectional view of a configuration including a second chamber 4 and components connected to the second chamber 4.

FIG. 5 is an enlarged cross-sectional view of a configuration including a third chamber 12 and components connected to the third chamber 12.

FIG. 6 is an enlarged cross-sectional view of a configuration including a fourth chamber 8 and components connected to the fourth chamber 8.

FIG. 7 is an enlarged cross-sectional view for explaining a process of cleaning spray nozzles 1 with a cleaning fluid.

EMBODIMENTS FOR IMPLEMENTING THE INVENTION

The present invention relates to a film forming apparatus for forming a film on a substrate in the atmosphere. A substrate is placed in an open space in the atmosphere, and a solution misting unit illustrated in FIG. 1 is provided in an open space above the substrate. The present invention will now be described in detail with reference to drawings illustrating an embodiment of the invention.

Embodiment

FIG. 1 is a cross-sectional view showing a configuration of principal part (more specifically, in the vicinity of a solution misting unit that mists a solution onto a substrate) of a film forming apparatus according to an embodiment of the present invention. FIG. 1 shows X, Y, and Z directions. FIG. 2 is a plan view showing the configuration in FIG. 1 viewed from above in FIG. 1. FIG. 2 shows the X and Y directions. To simplify the drawing, constituent elements 16, 17, and 60 are not shown in FIG. 2.

FIG. 3 is an enlarged cross-sectional view of a configuration including a first chamber 2 and constituent elements 1 and 3 connected to the first chamber 2, which are shown in FIG. 1. FIG. 4 is an enlarged cross-sectional view of a configuration including a second chamber 4 and a constituent element 6 connected to the second chamber 4, which are shown in FIG. 1. FIG. 5 is an enlarged cross-sectional view of a configuration including a third chamber 12 and a constituent element 14 connected to the third chamber 12, which are shown in FIG. 1. FIG. 6 is an enlarged cross-sectional view of a configuration including a fourth chamber 8 and a constituent element 7 connected to the fourth chamber 8, which are shown in FIG. 1.

The configuration of the film forming apparatus according to the present embodiment will now be described in detail with reference to FIGS. 1 to 6.

As illustrated in FIG. 1, the solution misting unit includes the four chambers 2, 4, 8, and 12, each partitioned by wall surfaces. In other words, the chambers 2, 4, 8, and 12 are each surrounded by wall surfaces to form a storage space as in the configuration example in FIG. 1.

In the configuration example in FIG. 1, the first chamber 2 is adjacent to the second chamber 4 in the X direction (on the right side in FIG. 1). The second chamber 4 is adjacent to the third chamber 12 in the X direction (on the right side in FIG. 1). That is, the first chamber 2, the second chamber 4, and the third chamber 12 are adjacent in the order specified in the X direction. The first chamber 2 is also adjacent to the fourth chamber 8 in the −Z direction (on the lower side in FIG. 1).

The configuration including the first chamber 2 will first be described with reference to FIGS. 1, 2, and 3.

As illustrated in FIG. 2, the first chamber 2 is rectangular in plan view and extends in the Y direction. The first chamber 2 is surrounded by wall surfaces to form a storage space as illustrated in FIGS. 1 and 3. In other words, the wall surfaces provided on the upper, lower, right, and left sides of the first chamber 2 form a closed space in the first chamber 2.

As illustrated in FIGS. 1 and 3, the wall surface of the first chamber 2 that is adjacent to the second chamber 4 has a through hole 5 that connects the first chamber 2 and the second chamber 4. There may be only a single through hole 5, or there may be a plurality of through holes 5. The through hole 5 may have an arbitrary opening shape; one example is a rectangle (slit) extending in the Y direction.

Spray nozzles 1 from which a solution in droplet form is sprayed are provided as illustrated in FIGS. 1 and 3. Here, a solution that has been transformed into droplets by the "spray method" is sprayed from spray outlets 1*a* of the spray nozzles 1. In other words, droplets of approximately several ten micrometers in diameter are sprayed from the spray nozzles 1. The spray nozzles 1 may, for example, be two-fluid spray nozzles mentioned above. Note that the solution contains a raw material of the film to be formed on a substrate 50.

Figure 3:
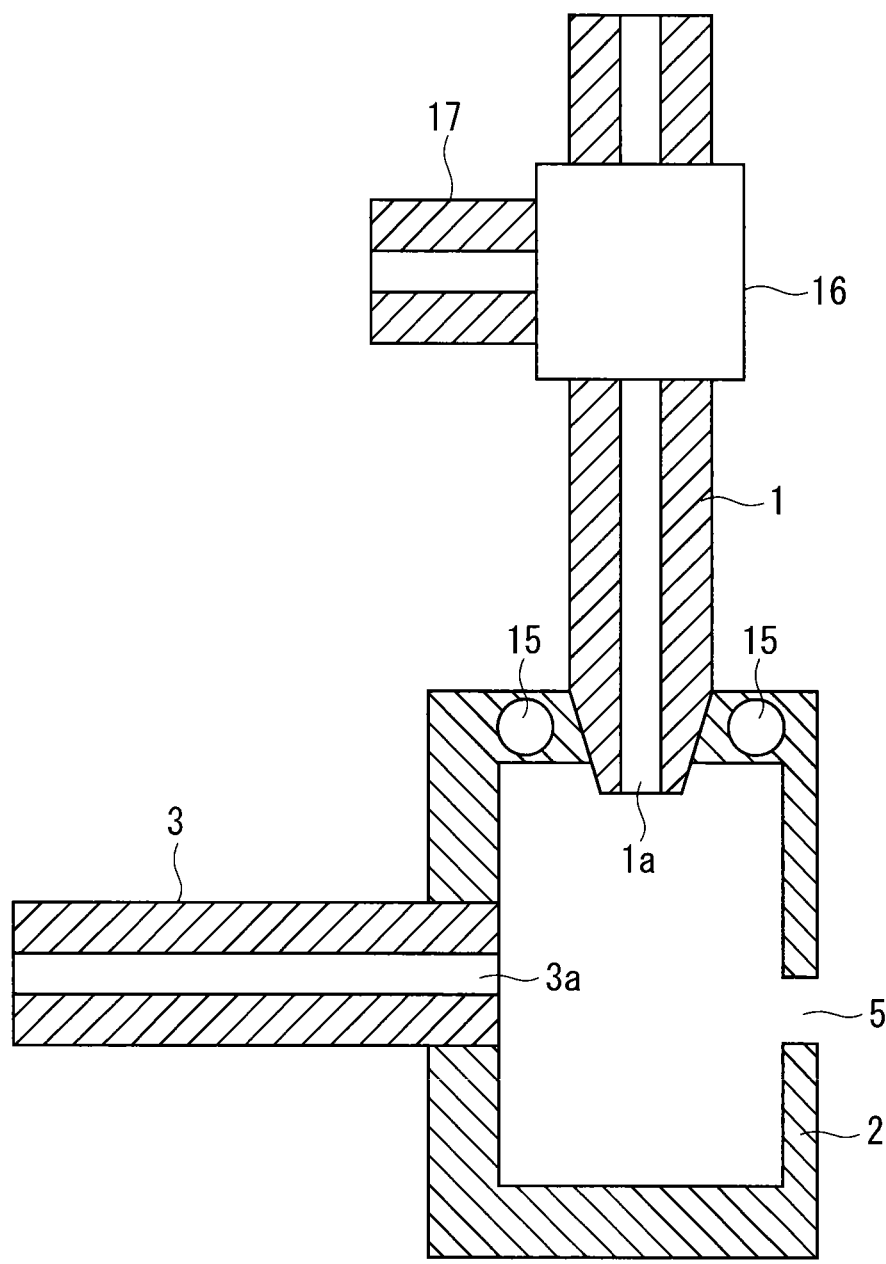
Figure 4:
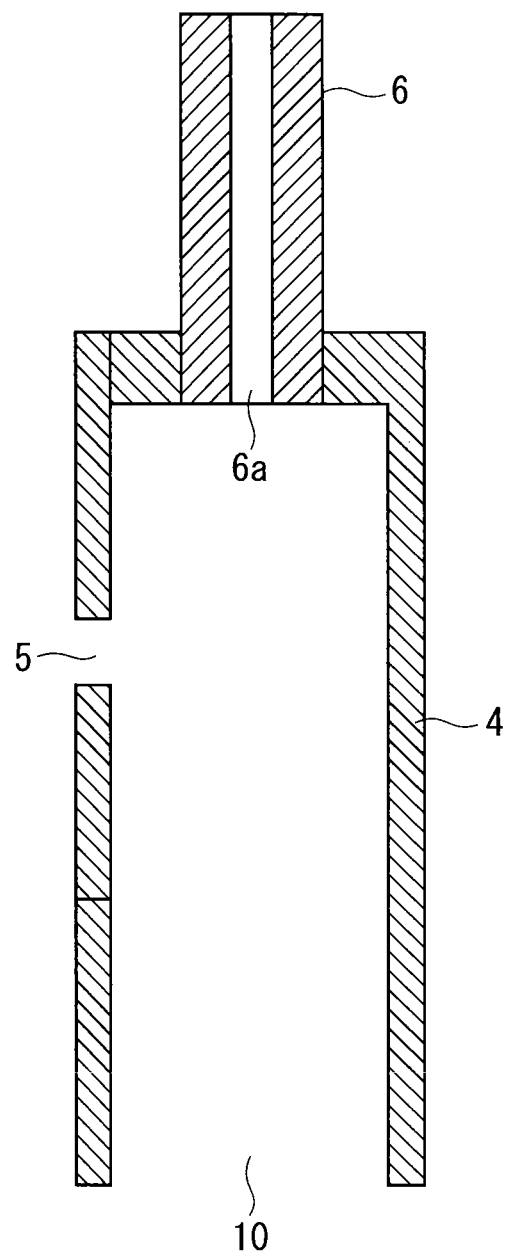

In the configuration example in FIGS. 1 and 3, a switching valve 16 connected to a cleaning liquid supply nozzle 17 is provided on a path of each spray nozzle 1. A cleaning liquid for cleaning the inside of the spray nozzle 1 is injected from a cleaning liquid supply port of the cleaning liquid supply nozzle 17.

When the switching valve 16 is switched to one position, only the cleaning liquid supply port of the cleaning liquid supply nozzle 17 is closed, and only the solution flows into the spray nozzle 1. When the switching valve 16 is switched to the other position, the cleaning liquid supply port of the cleaning liquid supply nozzle 17 is opened, and the fluid path of the spray nozzle 1 is closed upstream of the switching valve 16. In this case, only the cleaning liquid injected from the cleaning liquid supply port of the cleaning liquid supply nozzle 17 flows into the spray nozzle 1 downstream of the switching valve 16.

Figure 2:
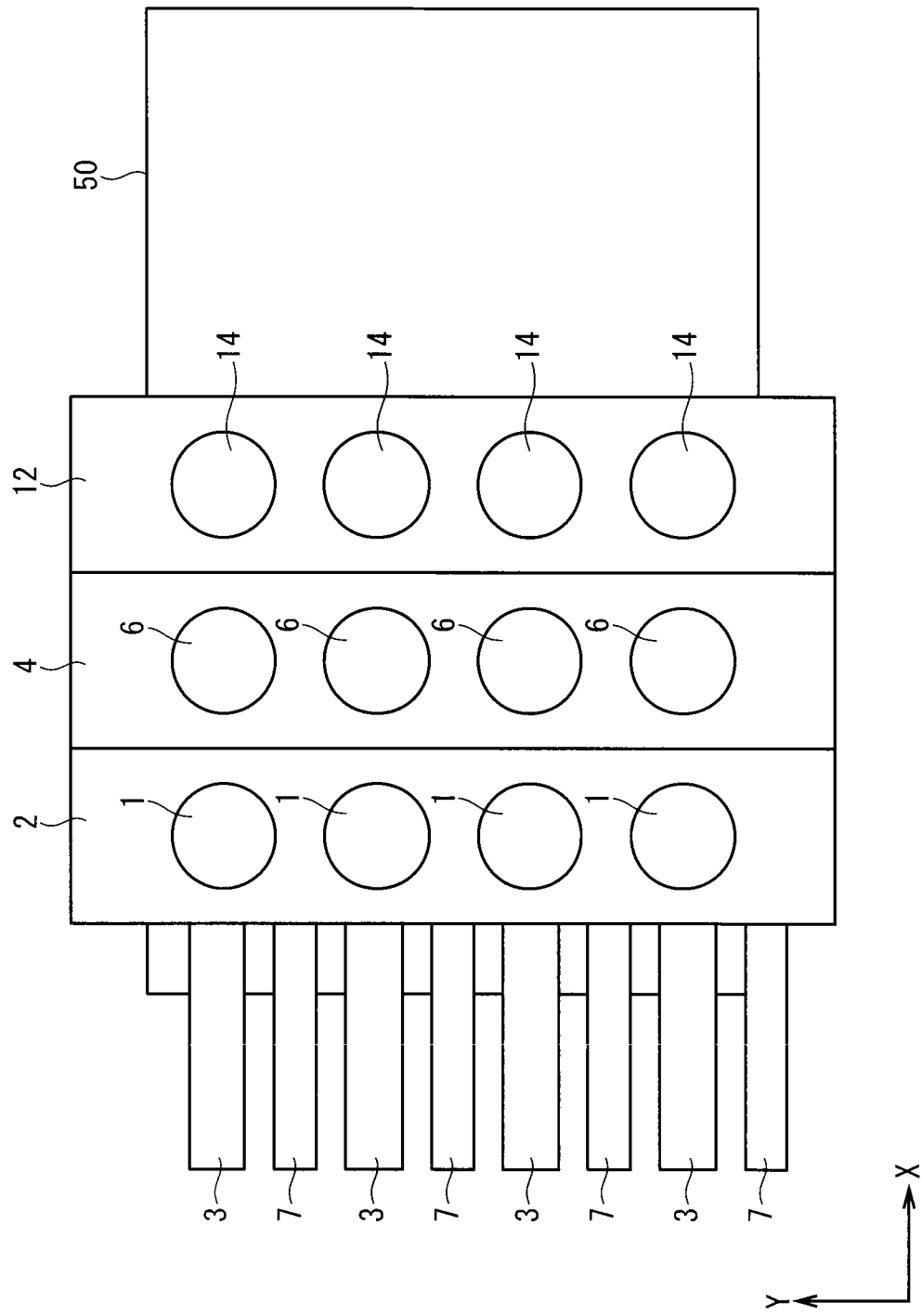

The upper wall surface of the first chamber 2 has a plurality of holes in which one end of the spray nozzles 1 (portion of the spray nozzles 1 that is downstream of the switching valve 16) is inserted. Here, a plurality of spray nozzles 1 may be connected to the upper surface of the first chamber 2 as illustrated in FIG. 2 (in the configuration example in FIG. 2, the spray nozzles 1 are aligned at a predetermined interval in the Y direction), or only a single spray nozzle 1 may be connected to the upper surface of the first chamber 2. With the spray nozzles 1 connected to the first chamber 2, the holes in the upper surface of the first chamber 2 (holes in which the spray nozzles 1 are inserted) are sealed.

The ends of the spray nozzles 1 penetrate the upper wall surface of the first chamber 2, and the spray outlets 1a of the spray nozzles 1 are inside the first chamber 2. A solution in the form of droplets of approximately several ten micrometers in diameter is sprayed from the spray outlets 1a of the spray nozzles 1 into the first chamber 2, and the sprayed solution is housed in the first chamber 2.

As illustrated in FIGS. 1, 2, and 3, a plurality of first gas supply nozzles 3 are provided, and gas is injected from first gas supply ports 3*a* of the first gas supply nozzles 3.

The left wall surface of the first chamber 2 has a plurality of holes in which one end of the first gas supply nozzles 3 is inserted. Here, a plurality of first gas supply nozzles 3 may be connected to the side surface of the first chamber 2 as illustrated in FIG. 2 (in the configuration example in FIG. 2, the first gas supply nozzles 3 are arranged at a predetermined interval in the Y direction), or only a single first gas supply nozzle 3 may be connected to the side surface of the first chamber 2.

The gas injected from the first gas supply ports 3*a* of the first gas supply nozzles 3 collide with the solution in droplet form that is housed in the first chamber 2. The first gas supply ports 3*a* are desirably directed toward the solution sprayed from the spray nozzles 1 so that the gas injected from the first gas supply nozzles 3 collides with the solution sprayed from the spray nozzles 1.

With the first gas supply nozzles 3 connected to the first chamber 2, the holes in the side surface of the first chamber 2 (holes in which the first gas supply nozzles 3 are inserted) are sealed.

The collision of the gas injected from the first gas supply nozzles 3 with the solution sprayed from the spray nozzles 1 transforms the solution in droplet form into a mist. In other words, this collision produces a solution in the form of a mist of droplets of approximately several micrometers in diameter in the first chamber 2.

As described above, the right side wall of the first chamber 2 has the through hole 5 that communicates with the second chamber 4. It is thus desirable for the above solution in mist form to be led to the through hole 5 with a stream of the gas injected from the first gas supply nozzles 3. In other words, it is desirable for the through hole 5 to be formed at a position that is on an extension of the injection direction in which the gas is injected from the first gas supply nozzles 3.

A heat regulator 15 capable of adjusting the temperature is provided in the upper wall surface of the first chamber 2 as illustrated in FIGS. 1 and 3. The heat regulator 15 is provided in the vicinity of the ends of the spray nozzles 1 and is capable of adjusting the temperature of these ends to a predetermined value.

Next, the configuration including the second chamber 4 will be described with reference to FIGS. 1, 2, and 4.

Like the first chamber 2, the second chamber 4 is rectangular in plan view and extends in the Y direction as illustrated in FIG. 2 (in the configuration example in FIG. 2, the first chamber 2 and the second chamber 4 have the same dimension in the Y direction, and their ends are aligned on both sides). As illustrated in FIGS. 1 and 4, the second chamber 4 is surrounded by wall surfaces, except on the lower side, to form a storage space. In other words, the wall surfaces provided on the upper, right, and left sides of the second chamber 4 form a closed space, except on the lower side, in the second chamber 4.

The lower surface of the second chamber 4 has an open mist outlet 10. The mist outlet 10 faces, at a predetermined distance, the main surface of the substrate 50 that is placed on a substrate placement part 60 outside the second chamber 4 (see FIG. 1). Thus, the solution in mist form is misted from the mist outlet 10 onto the main surface of the substrate 50. The mist outlet 10 is a rectangular opening (slit) extending in the Y direction.

As described previously, the wall surface of the second chamber 4 that is adjacent to the first chamber 2 has the through hole 5, which connects the first chamber 2 and the second chamber 4.

As illustrated in FIGS. 1, 2, and 4, a plurality of second gas supply nozzles 6 are provided, and gas is injected from second gas supply ports 6*a* of the second gas supply nozzles 6.

The upper wall surface of the second chamber 4 has a plurality of holes in which one end of the second gas supply nozzles 6 is inserted. Here, a plurality of second gas supply nozzles 6 may be connected to the upper surface of the second chamber 4 as illustrated in FIG. 2 (in the configuration example in FIG. 2, the second gas supply nozzles 6 are aligned at a predetermined interval in the Y direction), or only a single second gas supply nozzle 6 may be connected to the upper surface of the second chamber 4. With the second gas supply nozzles 6 connected to the second chamber 4, the holes in the upper surface of the second chamber 4 (holes in which the second gas supply nozzles 6 are inserted) are sealed.

The solution that has been transformed into a mist in the first chamber 2 is conveyed through the through hole 5 into the second chamber 4 and housed in the second chamber 4. The gas injected from the second gas supply ports 6*a* leads the solution in mist form that is housed in the second chamber 2 toward the mist outlet 10.

Next, the configuration including the third chamber 12 will be described with reference to FIGS. 1, 2, and 5.

Figure 5:
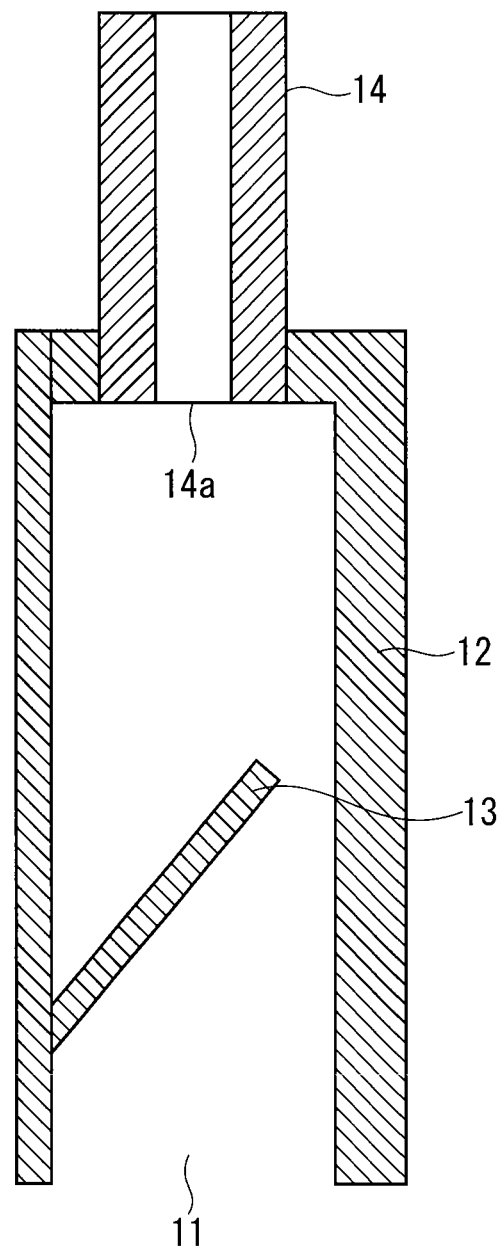

Like the first chamber 2 and the second chamber 4, the third chamber 12 is rectangular in plan view and extends in the Y direction as illustrated in FIG. 2 (in the configuration example in FIG. 2, the first chamber 2, the second chamber 4, and the third chamber 12 have the same dimension in the Y direction, and their ends are aligned on both sides). As illustrated in FIGS. 1 and 5, the third chamber 12 is surrounded by wall surfaces, except on the lower side, to form a storage space. In other words, the wall surfaces provided on the upper, right, and left sides of the third chamber 12 form a closed space, except on the lower side, in the third chamber 12.

The lower surface of the third chamber 12 has an open exhaust port 11. The exhaust port 11 faces, at a predetermined distance, the main surface of the substrate 50 that is placed on the substrate placement part 60 outside the third chamber 12 (see FIG. 1). Unreacted liquids or gas remaining above the substrate 50 are sucked through the exhaust port 11. The exhaust port 11 is a rectangular opening (slit) extending in the Y direction. As illustrated in FIG. 1, the exhaust port 11 is adjacent to the right side of the mist outlet 10, and the mist outlet 10 and the exhaust port 11 are at the same height.

As illustrated in FIGS. 1, 2, and 5, a plurality of exhaust nozzles 14 are provided, and suction is exerted through exhaust holes 14*a* of the exhaust nozzles 14.

The upper wall surface of the third chamber 12 has a plurality of holes in which one end of the exhaust nozzles 14 is inserted. Here, a plurality of exhaust nozzles 14 may be connected to the upper surface of the third chamber 12 as illustrated in FIG. 2 (in the configuration example in FIG. 2, the exhaust nozzles 14 are aligned at a predetermined interval in the Y direction), or only a single exhaust nozzle 14 may be connected to the upper surface of the third chamber 12. With the exhaust nozzles 14 connected to the third chamber 12, the holes in the upper surface of the third chamber 12 (holes in which the exhaust nozzles 14 are inserted) are sealed.

Note that the third chamber 12 has formed therein a partition plate 13 that extends diagonally upward as illustrated in FIGS. 1 and 5. One end of the partition plate 13 is connected to one side surface of the third chamber 12, but the other end of the partition plate 13 is not connected to the other side surface of the third chamber 12.

By the suction exerted through the exhaust nozzles 14, gas and liquids remaining above the substrate 50 are drawn up through the exhaust port 11. The presence of the partition plate 13 inhibits gas and liquids that are sucked through the exhaust port 11 above the partition plate 13 in the third chamber 12 from dropping back toward the exhaust port 11.

Next, the configuration including the fourth chamber 8 will be described with reference to FIGS. 1, 2, and 6.

The fourth chamber 8 is provided on the underside of the first chamber 2, and like the first chamber 2, is rectangular in plan view and extends in the Y direction (the first chamber 2 and the fourth chamber 8 have the same dimension in the Y direction, and their ends are aligned on both sides). As illustrated in FIGS. 1 and 6, the fourth chamber 8 is surrounded by wall surfaces to form a storage space. In other words, the wall surfaces provided on the upper, lower, right, and left sides of the fourth chamber 8 form a closed space in the fourth chamber 8.

The lower wall surface of the fourth chamber 8 has a third gas supply port 9. The third gas supply port 9 faces, at a predetermined distance, the main surface of the substrate 50 that is placed on the substrate placement part 60 outside the fourth chamber 8 (see FIG. 1). Gas is ejected from the third gas supply port 9 toward the upper surface of the substrate 50. The third gas supply port 9 is a rectangular opening (slit) extending in the Y direction. As illustrated in FIG. 1, the third gas supply port 9 is adjacent to the left side of the mist outlet 10, and the mist outlet 10 and the third gas supply port 9 are at the same height.

Figure 6:
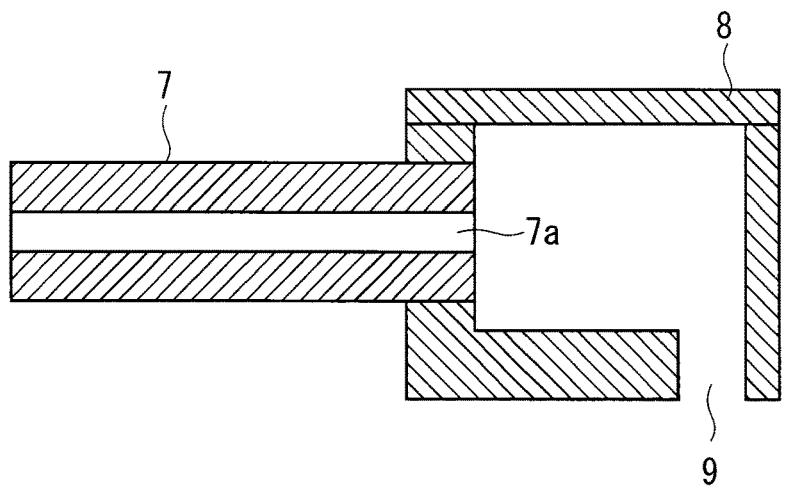
Figure 7:
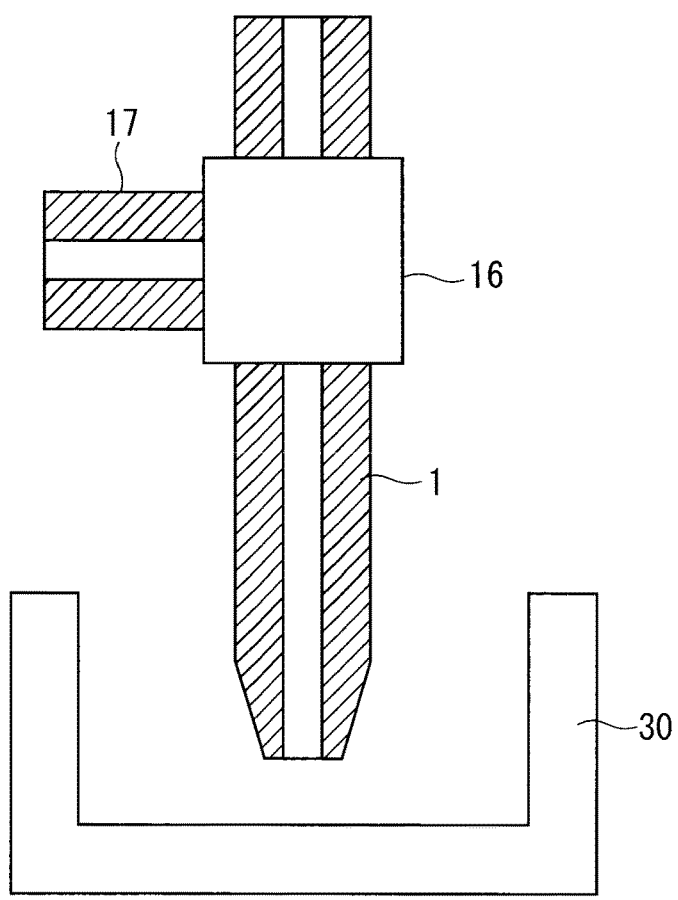

As illustrated in FIGS. 1, 2, and 6, a plurality of third gas supply nozzles 7 are provided, and gas is ejected from exhaust ports 7*a* of the third gas supply nozzles 7 into the fourth chamber 8.

A side wall surface of the fourth chamber 8 has a plurality of holes in which one end of the third gas supply nozzles 7 is inserted. Here, a plurality of third gas supply nozzles 7 may be connected to the side surface of the fourth chamber 8 as illustrated in FIG. 2 (in the configuration example in FIG. 2, the third gas supply nozzles 7 are arranged at a predetermined interval in the Y direction), or only a single third gas supply nozzle 7 may be connected to the side surface of the fourth chamber 8. With the third gas supply nozzles 7 connected to the fourth chamber 8, the holes in the side surface of the fourth chamber 8 (holes in which the third gas supply nozzles 7 are inserted) are sealed.

The gas injected from the third gas supply nozzles 7 is housed in the fourth chamber 8 and then injected to the upper surface of the substrate 50 from the third gas supply port 9 of the fourth chamber 8.

Note that the film forming apparatus is provided with the substrate placement part 60 on which the substrate 50 is placed as illustrated in FIG. 1. The substrate placement part 60 on which the substrate 50 is placed moves in the left and right directions (X direction) (any horizontal movement is possible). Specifically, this movement of the substrate placement part 60 causes the substrate 50 to move in the horizontal direction while the solution in mist form is misted in the vertical direction from the mist outlet 10 onto the substrate 50. Also, the substrate placement part 60 includes a heater 61 that heats the substrate 50 placed on the substrate placement part 60 to a predetermined temperature (temperature for film formation).

Next, the film forming process will be described.

The substrate 50 is placed on the substrate placement part 60. The substrate placement part 60 is then moved in the X direction until the substrate 50 moves to a position under the mist outlet 10. Here, the heater 61 of the substrate placement part 60 heats the substrate 50 to the temperature for film formation.

Meanwhile, a solution in spray form (solution in droplet form) is sprayed from the spray nozzles 1 into the first chamber 2. Here, the switching valve 16 has been switched to one position in which the cleaning liquid supply port of the cleaning liquid supply nozzle 17 is closed. Thus, only the solution flows through the fluid path of the spray nozzle 1. Also, the gas is ejected from the first gas supply ports 3*a* toward the solution in spray form that is housed in the first chamber 2.

The resultant collision of the gas ejected from the first gas supply ports 3*a* with the solution in spray form produces a solution in mist form in the first chamber 2. In other words, this collision further reduces the particle diameter of the solution in spray form and accordingly atomizes the solution.

The solution in mist form is led through the through hole 5 into the second chamber 4 with a stream of the gas ejected from the first gas supply ports 3*a*. In the second chamber 4, the solution in mist form is led toward the mist outlet 10 with a stream of the gas ejected from the second gas supply ports 6a. The solution in mist form is then misted from the mist outlet 10 onto the upper surface of the substrate 50.

Here, the suction exerted through the exhaust port 11 produces a flow from the mist outlet 10 toward the exhaust port 11. That is, a flow in which the solution in mist form misted from the mist outlet 10 moves toward the exhaust port 11 is produced on the upper surface side of the substrate 50. Gas and liquids sucked through the exhaust port 11 are exhausted to the outside via the third chamber 12 and the exhaust nozzles 14.

When the solution in mist form is misted from the mist outlet 10, gas is ejected from the third gas supply port 9 toward the upper surface of the substrate 50. As described previously, the gas ejected from the third gas supply port 9 has been supplied from the third gas supply nozzles 7 into the fourth chamber 8. The ejection of the gas from the third gas supply port 9 prevents the solution misted from the mist outlet 10 from leaking to the left side of the third gas supply port 9. In other words, the gas ejected from the third gas supply port 9 functions as a "screen" against the solution misted from the mist outlet 10.

The suction exerted through the exhaust port 11 also produces a flow from the third gas supply port 9 to the exhaust port 11. That is, a flow in which the gas injected from the third gas supply port 9 moves toward the exhaust port 11 is produced on the upper surface side of the substrate 50.

Simultaneously with the misting of the solution from the mist outlet 10, the suction exerted through the exhaust port 11, and the ejection of the gas from the third gas supply port 9 described above, the substrate placement part 60 is moved in the X direction. Accordingly, the solution misted from the mist outlet 10 reacts with the air and forms a uniform film over the entire upper surface of the heated substrate 50.

Here, the solution sprayed from the spray nozzles 1 can be arbitrarily selected according to the film to be formed. The gas to be ejected from the nozzles 3, 6, and 7 can also be selected arbitrarily.

For example, in the case where a solution that has high reactivity with oxygen is sprayed from the spray nozzles 1, it is desirable to inject an inert gas from the first gas supply ports 3a and the second gas supply ports 6a and to inject an oxidizing agent (e.g., a fluid containing water, oxygen, or ozone) from the third gas supply port 9. This inhibits oxidation of the solution inside the first chamber 2 and the second chamber 4 and accelerates the reaction of the misted solution and the oxidizing agent in the space between the mist outlet 10 and the substrate 50.

In the case where a solution that has high reactivity with oxygen is sprayed from the spray nozzles 1, it is also possible to inject an inert gas from the first gas supply ports 3a and to inject an oxidizing agent (e.g., oxygen or ozone) from the second gas supply ports 6a. In this case, for example, air may be injected from the third gas supply port 9. This inhibits oxidation of the solution inside the first chamber 2 and accelerates the reaction of the solution in mist form and the oxidizing agent, thus enabling the solution that is oxidizing to be misted toward the substrate 50.

As described above, the film forming apparatus according to the present embodiment includes the first chamber 2 capable of housing a solution in droplet form that is sprayed from the spray nozzles 1. The film forming apparatus also includes the first gas supply ports 3a from which the gas is to be injected and caused to collide with the solution housed in the first chamber 2, and the second chamber 4 adjacent to the first chamber 2. The wall surface between the first chamber 2 and the second chamber 4 has the through hole 5 through which the solution in mist form flows. The film forming apparatus also includes the mist outlet 10, which is formed in the second chamber 4 to face the substrate 50 placed outside the second chamber 4 and from which the solution in mist form is misted onto the substrate 50.

The film forming apparatus thus enables the solution in droplet form, which is sprayed from the spray nozzles 1, to be transformed into a mist inside the first chamber 2 by bombarding the solution with the gas ejected from the first gas supply ports 3a. This enables the solution in spray form to be transformed into a mist and misted onto the substrate 50, without the solution coming in direct contact with the substrate 50. It is thus possible to achieve film formation similar to CVD film formation in the atmosphere. The film forming apparatus can therefore form a high-quality film on the substrate 50.

Moreover, the film forming apparatus transforms a solution in spray form into a mist inside the first chamber 2, which is located in the vicinity of the mist outlet 10 from which the solution is misted onto the substrate 50. This makes the conveyance distance of the solution in mist form considerably shorter than in conventional film forming apparatuses employing the mist method, inhibiting coagulation of the solution in mist form during conveyance. The film forming apparatus according to the present invention can therefore effectively use the solution in the film forming process and mist the solution with a stable concentration onto the substrate 50.

Moreover, the film forming apparatus according to the present invention transforms a solution in spray form into a mist by bombarding the sprayed solution with the gas. In other words, the film forming apparatus according to the present invention has an extremely simple configuration for transforming a solution into a mist and also eliminates the need for an ultrasonic vibrator or other elements. The film forming apparatus according to the present invention can therefore achieve downsizing of the apparatus as a whole. This simple configuration also contributes to increased ease of maintenance of the film forming apparatus according to the present invention.

Therefore, the film forming apparatus according to the present invention can have the benefits of both the mist method and the spray method, i.e., the improved film quality achieved by the mist method and the simple configuration and increased ease of maintenance achieved by the spray method.

Additionally, the first chamber 2 can prevent the solution in large droplet form sprayed from the spray nozzle 1 from scattering around the chamber. The second chamber 4 can also prevent the solution in mist form from scattering around the chamber. The fourth chamber 8 can also prevent the gas from scattering around the chamber. The third chamber 12 enables processing for collectively discharging liquids and gas.

The film forming apparatus according to the present invention further includes the second gas supply ports 6a from which the gas is injected to lead the solution in mist form that is housed in the second chamber 4 toward the mist outlet 10. This produces a flow of supply of the solution in mist form to the substrate 50.

The film forming apparatus according to the present invention further includes the exhaust port 11 adjacent to the mist outlet 10. This produces a flow from the mist outlet 10 to the exhaust port 11. That is, a flow in which the solution in mist form misted from the mist outlet 10 moves toward the exhaust port 11 is produced on the upper surface side of the substrate 50.

The film forming apparatus according to the present invention further includes the third gas supply port 9 that is provided adjacent to the mist outlet 10 and from which the gas is injected. This prevents the solution misted from the mist outlet 10 from leaking to the left side of the third gas supply port 9.

Here, the mist outlet 10, the exhaust port 11, and the third gas supply port 9 are each in the shape of a slit extending in the Y direction. It is thus possible to uniformly mist the solution in mist form that is housed in the second chamber 4 from the mist outlet 10, uniformly inject the gas housed in the fourth chamber 8 from the third gas supply port 9, and uniformly exhaust the gas in the Y direction from the exhaust port 11.

In the film forming apparatus according to the present invention, the spray nozzles 1 are provided through the upper wall surface of the first chamber 2. This wall surface through which the spray nozzles 1 are provided includes the heat regulator 15.

It is thus possible to keep the vicinity of the spray outlets 1*a* of the spray nozzles 1 at a predetermined temperature. This prevents coagulation of the solution in the vicinity of the spray outlets 1*a* of the spray nozzles 1, thus preventing clogging of the spray nozzles 1.

The film forming apparatus according to the present invention further includes the substrate placement part 60 that moves in the horizontal direction. It is thus possible to form a film on the large-area substrate 50 without moving the constituent elements of the solution misting unit. Note that the substrate placement part 60 including the heater 61 can also heat the substrate 50 placed thereon.

Note that the film forming apparatus according to the present embodiment can also employ the following configuration.

Specifically, the film forming apparatus may include a moving mechanism for moving a unit consisting of the spray nozzles 1, the switching valves 16, and the cleaning liquid supply nozzles 17 in the vertical and horizontal directions. In this case, the film forming apparatus performs the following processing when cleaning the spray nozzles 1.

The aforementioned unit is first moved in the up direction in FIG. 1 by the aforementioned moving mechanism to pull the ends of the spray nozzles 1 out of the upper wall surface of the first chamber. The unit is then moved in, for example, the horizontal direction by the moving mechanism. The ends of the spray nozzles 1 are accordingly located above a container 30, which is provided outside the area for the film forming process, as illustrated in FIG. 7.

Then, the switching valves 16 are switched to one position in which the cleaning liquid supply ports of the cleaning liquid supply nozzles 17 are opened, and the fluid paths of the spray nozzles 1 are closed upstream of the switching valves 16. This creates a situation in which the cleaning liquid supply ports, from which the cleaning liquid is supplied, are connected to the fluid paths of the spray nozzles 1.

Then, the cleaning liquid flowing from the cleaning liquid supply nozzles 17 flows through the fluid paths of the spray nozzles 1 to clean contamination caused by the solution flowing through the fluid paths of the spray nozzles 1. Note that the cleaning liquid output from the spray outlets 1*a* of the spray nozzles 1 is housed in the container 30.

In the case of performing the film forming process after the cleaning of the spray nozzles 1, the unit is moved by the moving mechanism so that the spray nozzles 1 are inserted into the holes in the upper surface of the first chamber 2 as illustrated in FIG. 1. Then, the switching valves 16 are switched to the other position in which only the cleaning liquid supply ports of the cleaning liquid supply nozzles 17 are closed, and only the solution flows through the fluid paths of the spray nozzles 1.

The above-described moving and cleaning mechanisms enable appropriate cleaning of the spray nozzles 1 that are contaminated by the film forming process.

In the present invention, the solution misting unit illustrated in FIG. 1 is provided in an open space in the atmosphere, and the space between the solution misting unit and the substrate 50 is not closed due to horizontal movement of the substrate placement part 60. In the present invention, the presence of the exhaust port 11 produces a constant fluid flow in the space (i.e., open space) between the solution misting unit and the substrate 50.

The film forming apparatus according to the present invention can therefore prevent adhesion of particles such as products in the space between the solution misting unit and the substrate 50. Accordingly, the film forming apparatus can also prevent deterioration in the quality of the formed film due to the mixing of particles to the film.

The open space between the solution misting unit and the substrate 50 also increases the ease of maintenance of the portion of the solution misting unit that faces the substrate 50. In addition, the gas is injected from the second gas supply ports 6*a* to lead the solution in mist form from the second chamber 4 to the mist outlet 10 (i.e., the substrate 50). This makes it possible to increase the distance between the solution misting unit and the substrate 50, thus enhancing the above-described effect.

While the invention has been shown and described in detail, the foregoing description is in all aspects illustrative and not restrictive. It is therefore to be understood that numerous modifications and variations can be devised without departing from the scope of the invention.

DESCRIPTION OF REFERENCE NUMERALS

1 Spray nozzle
1*a* Spray outlet
2 First chamber
3 First gas supply nozzle
3*a* First gas supply port
4 Second chamber
5 Through hole
6 Second gas supply nozzle
6*a* Second gas supply port
7 Third gas supply nozzle
8 Fourth chamber
9 Third gas supply port
10 Mist outlet
11 Exhaust port
12 Third chamber
13 Partition plate
14 Exhaust nozzle
15 Heat regulator
16 Switching valve
17 Cleaning liquid supply nozzle
30 Container
50 Substrate
60 Substrate placement part

The invention claimed is:

1. A film forming apparatus for forming a film on a substrate, comprising:

a spray nozzle from which a solution in droplet form is to be sprayed;

a first chamber to house said solution in droplet form that is to be sprayed from said spray nozzle;

a first gas supply port from which gas is to be injected and caused to collide with said solution housed in said first chamber, said solution in droplet form being transformed into a mist by colliding with said gas injected from said first gas supply port in said first chamber;

a second chamber provided adjacent to said first chamber;

a through hole that is formed in a wall surface between said first chamber and said second chamber and through which said solution in mist form is led from said first chamber into said second chamber;

a mist outlet that is formed in said second chamber to face said substrate provided outside said second chamber and from which said solution in mist form is misted onto said substrate; and a second gas supply port formed in said second chamber, from which gas is to be injected to lead said solution in mist form that is housed in said second chamber to said mist outlet, wherein a cross-sectional area of the second chamber along planes parallel to the substrate is substantially constant from the second gas supply port to the mist outlet.

2. The film forming apparatus according to claim 1, further comprising:

an exhaust port that is formed facing said substrate and adjacent to one side of said mist outlet and through which a fluid is to be exhausted.

3. The film forming apparatus according to claim 2, further comprising:

a third gas supply port that is formed facing said substrate and adjacent to another side of said mist outlet and from which gas is to be injected.

4. The film forming apparatus according to claim 1, wherein said mist outlet is a rectangular opening.

5. The film forming apparatus according to claim 2, wherein said exhaust port is a rectangular opening.

6. The film forming apparatus according to claim 3, wherein said third gas supply port is a rectangular opening.

7. The film forming apparatus according to claim 1, wherein said spray nozzle is provided through a wall surface of said first chamber, and said wall surface through which said spray nozzle is provided includes a heat regulator to adjust a temperature.

8. The film forming apparatus according to claim 1, wherein said spray nozzle is movable, and said spray nozzle includes a cleaning liquid supply port from which a cleaning liquid is supplied to a fluid path of said spray nozzle.

9. The film forming apparatus according to claim 1, further comprising:

a substrate placement device on which said substrate is to be placed and that moves in a horizontal direction relative to said mist outlet.

10. The film forming apparatus according to claim 9, wherein said substrate placement device is configured to heat the substrate.

11. The film forming apparatus according to claim 3, wherein said solution that reacts with oxygen is sprayed from said spray nozzle, an inert gas is injected from said first gas supply port, an inert gas is injected from said second gas supply port, and an oxidizing agent is injected from said third gas supply port.

12. The film forming apparatus according to claim 1, wherein said solution that reacts with oxygen is sprayed from said spray nozzle, an inert gas is injected from said first gas supply port, and an oxidizing agent is injected from said second gas supply port.

* * * * *